(12) United States Patent
Reddy (10) Patent No.: US 10,146,739 B2
(45) Date of Patent: Dec. 4, 2018

(54) VECTOR SIGNAL ALIGNMENT FOR DIGITAL VECTOR PROCESSING USING VECTOR TRANSFORMS

(71) Applicant: Alcatel-Lucent USA Inc., Murray Hill, NJ (US)

(72) Inventor: Ajit K. Reddy, Cliffwood, NJ (US)

(73) Assignee: Alcatel Lucent, Boulogne-Billancourt (FR)

(*) Notice: Subject to any disclaimer, the term of this patent is extended or adjusted under 35 U.S.C. 154(b) by 794 days.

(21) Appl. No.: 14/633,571

(22) Filed: Feb. 27, 2015

(65) Prior Publication Data

US 2016/0253288 A1 Sep. 1, 2016

(51) Int. Cl.
| | | |
|---|---|---|
| *G06F 17/14* | (2006.01) | |
| *H04L 25/49* | (2006.01) | |
| *H03F 1/32* | (2006.01) | |
| *H03F 3/24* | (2006.01) | |
| *H04B 1/04* | (2006.01) | |

(52) U.S. Cl.
CPC ........... *G06F 17/14* (2013.01); *H03F 1/3247* (2013.01); *H03F 3/24* (2013.01); *H04B 1/04* (2013.01); *H04L 25/49* (2013.01); *H03F 2201/3227* (2013.01); *H04B 2001/0425* (2013.01)

(58) Field of Classification Search
CPC .............................. H03F 1/3241–1/3247; H03F 2201/3227–2201/3231; H04B 2001/0408; H04B 2001/0425; H04B 1/0475; H04L 27/368
See application file for complete search history.

(56) References Cited

U.S. PATENT DOCUMENTS

| | | | |
|---|---|---|---|
| 8,111,101 B2 | 2/2012 | Brown et al. | |
| 9,036,734 B1* | 5/2015 | Mauer | H04B 1/0475 375/295 |
| 2003/0156658 A1* | 8/2003 | Dartois | H03F 1/3247 375/297 |
| 2005/0286619 A1 | 12/2005 | Haddidin | |
| 2006/0008028 A1* | 1/2006 | Maltsev | H03F 1/3247 375/297 |
| 2006/0182193 A1 | 8/2006 | Monsen | |
| 2007/0018722 A1 | 1/2007 | Jaenecke | |
| 2007/0082617 A1* | 4/2007 | McCallister | H04B 1/0475 455/63.1 |
| 2007/0189431 A1 | 8/2007 | Waheed | |
| 2008/0218262 A1 | 9/2008 | Ziegler et al. | |

(Continued)

OTHER PUBLICATIONS

R. Soosahabi, N. Nasirian, M. Naraghi-Pour and M. Bayoumi, "A fast new method to mitigate amplifier-induced ICI in OFDM systems based on predistortion in DFT domain," 2013 5th International Conference on Modeling, Simulation and Applied Optimization (ICMSAO), 2013.*

(Continued)

*Primary Examiner* — Matthew D Sandifer (57) ABSTRACT

A processor receives a first vector signal and a second vector signal from a circuit in response to the circuit receiving the first vector signal. The processor transforms the second vector signal from a time domain to a transform domain. The processor rotates the transformed second vector signal by a phase that is proportional to a time delay between the first and second vector signals to time-align the second vector signal to the first vector signal.

21 Claims, 4 Drawing Sheets

(56) References Cited

U.S. PATENT DOCUMENTS

| | | |
|---|---|---|
| 2008/0228292 A1 | 9/2008 | Reddy |
| 2008/0285640 A1 | 11/2008 | McCallister |
| 2012/0019320 A1* | 1/2012 | Cummins ............ H03F 1/0222 330/149 |

OTHER PUBLICATIONS

Chiu et al., "Predistorter Based on Frequency Domain Estimation for Compensation of Nonlinear Distortion in OFDM Systems", IEEE Transactions on Vehicular Technology, vol. 57, No. 2, Mar. 2008.*

Wikipedia, "Descrete Fourier transform", dated Jan. 30 2015, retrieved from https://en.wikipedia.org/w/index.php?title=Discrete_Fourier_transform&oldid=644814505.*

Stephen Boyd and Lieven Vandenberghe, "Introduction to Applied Linear Algebra—Vectors, Matrices, and Least Squares", Cambridge University Press, 2018.*

Math.com, "Vector Definitions", dated Jul. 1 2014, retrieved from https://web.archive.org/web/20140701115844/http://www.math.com/tables/oddsends/vectordefs.htm.*

Notice of Allowance dated Apr. 11, 2017 for U.S. Appl. No. 14/475,066, 16 pages.

International Search Report and Written Opinion correlating to PCT/US2016/018369 dated Jun. 21, 2016, 13 pages.

Shahabuddin Rahmania, et al., "Digital predistortion based on frequency domain estimation for OFDM systems with low complexity loop delay compensation", IEICE Electronics Express, vol. 9, No. 18, Jan. 1, 2012, 7 pages.

Mao-Ching Chiu, et al., "Predistorter Based on Frequency Domain Estimation for Compensation of Nonlinear Distortion in OFDM Systems", IEEE Transactions on Vehicular Technology, vol. 57, No. 2, Mar. 1, 2008, 11 pages.

Mattias Olsson et al., "Time-Delay Estimation Using Farrow-based Fractional-Delay Fir Filters: Filter Approximation vs. Estimation Errors", 14th European Signal Processing Conference (EUSIPCO 2006), Sep. 4-8, 2006, 5 pages.

"Digital Predistortion", Altera, <Http://www.altera.com/end-markets/wireless/advanced-dsp/predistortion/wir-digital-predistortion.html>, Accessed Sep. 2, 2014, 2 pages.

U.S. Appl. No. 14/475,066, filed Sep. 2, 2014, entitled "Fractional Delay Estimation for Digital Vector Processing Using Vector Transforms".

* cited by examiner

VECTOR SIGNAL ALIGNMENT FOR DIGITAL VECTOR PROCESSING USING VECTOR TRANSFORMS

CROSS REFERENCE TO RELATED APPLICATIONS

This application is related to U.S. patent application Ser. No. 14/475,066, entitled "FRACTIONAL DELAY ESTIMATION FOR DIGITAL VECTOR PROCESSING USING VECTOR TRANSFORMS" and filed on Sep. 2, 2014, the entirety of which is incorporated by reference herein.

BACKGROUND

Field of the Disclosure

The present disclosure relates generally to signal processing and, more particularly, to digital vector signal processing.

Description of the Related Art

Temporal alignment of signals is crucial to many aspects of wireless communication systems. For example, time alignment of input signals and feedback signals reduces cross-channel interference in the power amplifiers implemented in base stations and user equipment to amplify signals for transmission over the air interface. The power amplifiers are typically operated in a non-linear mode to achieve higher efficiency and reduce power consumption. However, the non-linear response of the power amplifier increases the frequency bandwidth of the output signal (relative to the frequency bandwidth of the input signal), which increases interference between different radio frequency carriers.

Digital predistortion can compensate for the effects of the non-linear power amplifier on the output signal by applying an inverse distortion to the input signal. The inverse distortion is determined by comparing the input signal to time-aligned feedback from the output of the power amplifier. Time alignment is conventionally performed using polynomial based interpolators such as a Farrow structure. Errors or inaccuracies in the time alignment of the input and feedback signals reduce the effectiveness of predistortion. The precision of the time alignment can be increased by increasing the degree or the number of taps implemented by the interpolator, e.g., the Farrow structure. However, polynomial interpolation is computationally intensive and improving the accuracy of the interpolators requires increasing the computation time and power consumption, which is not feasible for many current and future products.

SUMMARY OF EMBODIMENTS

The following presents a simplified summary of the disclosed subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

In some embodiments, a method is provided for aligning vector signals using vector transforms. The method includes receiving, at a processor, a first vector signal and a second vector signal from a circuit in response to the circuit receiving the first vector signal. The method also includes transforming, at the processor, the second vector signal from a time domain to a transform domain. The method further includes rotating, at the processor, the transformed second vector signal by a phase that is proportional to a time delay between the first and second vector signals to time-align the second vector signal to the first vector signal.

In some embodiments, an apparatus is provided to align vector signals using vector transforms. The apparatus includes a circuit to receive a first vector signal and generate a second vector signal in response to receiving the first vector signal. The apparatus also includes a processor to transform the second vector signal from a time domain to a transform domain and rotate the transformed second vector signal by a phase that is proportional to a time delay between the first and second vector signals to time-align the second vector signal to the first vector signal.

In some embodiments, a non-transitory computer readable medium is provided that embodies a set of executable instructions for aligning vector signals using vector transforms. The set of executable instructions manipulate a processor to receive a first vector signal and a second vector signal from a circuit in response to the circuit receiving the first vector signal. The set of executable instructions also manipulate the processor to transform the second vector signal from a time domain to a transform domain and rotate the transformed second vector signal by a phase that is proportional to a time delay between the first and second vector signals to time-align the second vector signal to the first vector signal.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Feedback vector signals can be accurately time-aligned with corresponding input vector signals by transforming the feedback vector signals from a time domain to a transform domain, rotating the transformed feedback vector signals in the transform domain based on a measured time delay between the feedback vector signals and the corresponding input vector signals, and then transforming the transformed feedback vector signals back into the time domain. Examples of transform kernels that may be used to transform the feedback vector signals between the time domain and the transform domain include Fourier transforms, wavelet transforms, Hartley transforms, and the like. In some embodiments, a DC offset is calculated for the feedback vector signal and removed from the feedback vector signal prior to transforming to the transform domain. The feedback vector signal may also be scaled by a gain factor determined by a ratio of power in the feedback signal (after the DC offset correction) to power in the input signal prior to transforming to the transform domain. The aligned feedback vector signal may also be scaled (after transformation back into the time domain) by a scaling factor determined based on the input signal and the aligned feedback vector signal. Aligning the feedback vector signal to the input vector signal in the transform domain may result in a minimal residue between the aligned feedback vector signal and the input vector signal.

Figure 1:
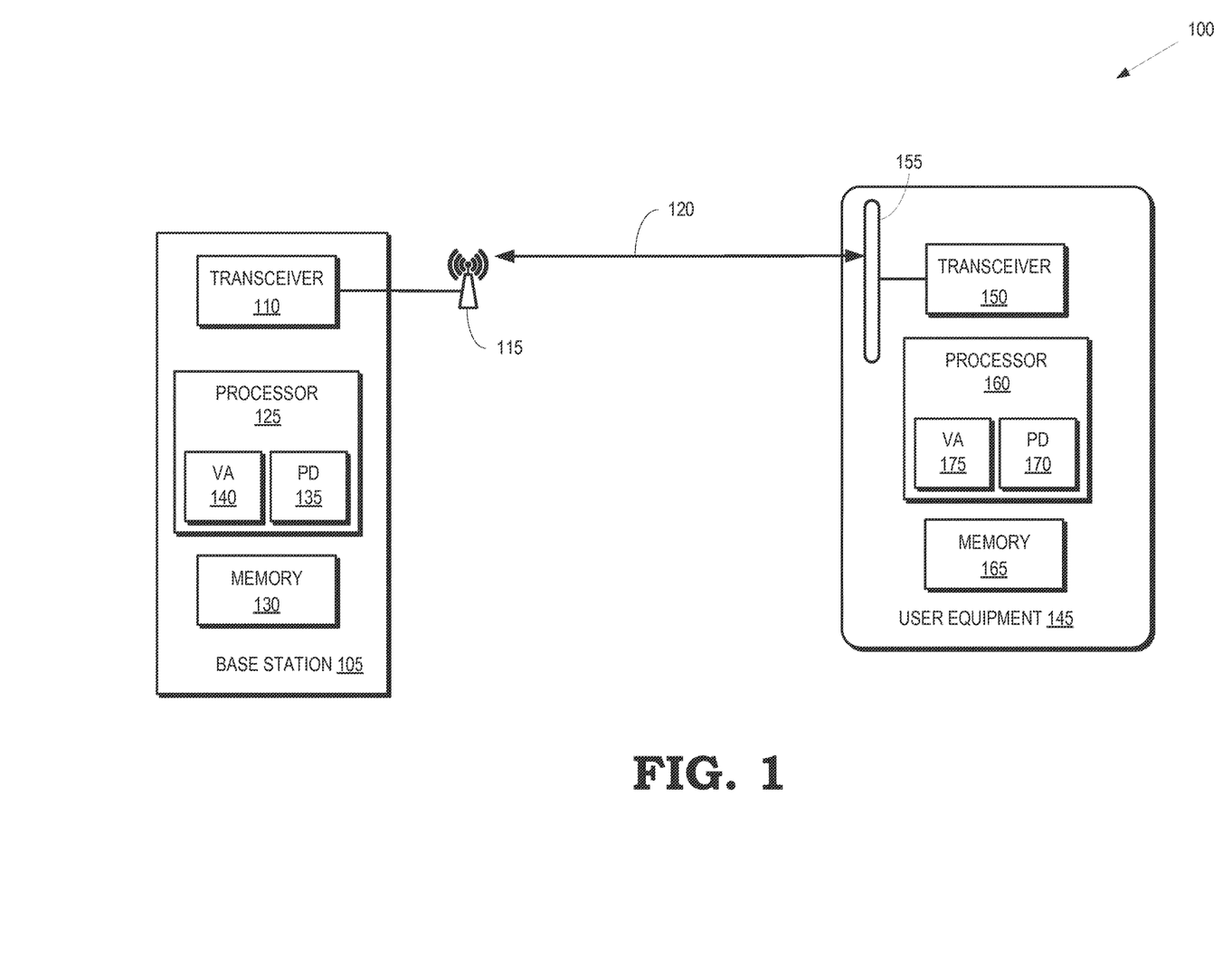
FIG. 1 is a block diagram of a wireless communication system according to some embodiments.

FIG. 1 is a block diagram of a wireless communication system 100 according to some embodiments. The communication system 100 includes a base station 105 that provides wireless connectivity according to one or more radio access technologies. For example, the base station 105 may be an integrated device that implements LTE communication and a Wi-Fi access point. The base station 105 includes a transceiver 110 for transmitting and receiving signals using one or more antennas 115. Some embodiments of the transceiver 110 include one or more power amplifiers for amplifying signals that are then provided to the one or more antennas 115 for transmission over an air interface 120.

The base station 105 also includes a processor 125 and a memory 130. The processor 125 may be used to execute instructions stored in the memory 130 and to store information in the memory 130 such as the results of the executed instructions. Some embodiments of the processor 125 operate on information representative of vector signals such as digital vector signals. For example, the digital vector signals may be complex signals with in-phase (I) and quadrature (Q) components. The length of the digital vector signals may be determined by the number of samples of the signal in a predetermined time interval, such as a frame.

Some embodiments of the processor 125 implement a predistortion module (PD) 135 that is used to pre-distort input signals before providing the input signals to the transceiver 110. The predistortion module 135 may therefore receive feedback signals from the transceiver 110 that correspond to the amplified output signals provided to the antenna 115. The predistortion module 135 compares the input signal to the feedback signal to determine the predistortion that is applied to the input signal. Predistortion of the input signals compensates for nonlinearities in power amplifiers in the transceiver 110 so that amplifying the pre-distorted signal produces an amplified signal that is substantially equal to (e.g., within a predetermined tolerance) a linear amplification of the original input signal. Techniques for implementing predistortion are known in the art.

Signal delays in the processor 125 or the transceiver 110 can generate a temporal misalignment between the input signal and the amplified output signal, which can reduce the efficacy of predistortion in the predistortion module 135. For example, if the delay between the input and output waveforms is not accurately cancelled, the residual delay causes additional dispersion in the amplitude modulation/amplitude modulation (AM/AM) and amplitude modulation/phase modulation (AM/PM) characteristics of look up tables (LUTs) that are used to define the predistortion coefficients applied to the input signal.

The processor 125 implements a vector alignment processor (VA) 140 to time-align a feedback signal from the power amplifier to the corresponding input signal. Some embodiments of the processor 125 receive the input vector signal and the feedback vector signal and transform the feedback vector signal from a time domain to a transform domain. For example, the vector alignment processor 140 may transform the feedback vector signal from the time domain to a transform domain using a Fourier transform, a wavelet transform, a Hartley transform, or other transform. The vector alignment processor 140 then rotates the transformed feedback vector signal by a phase that is proportional to a time delay between the input and feedback vector signals to phase-align the feedback vector signal to the input vector signal. Thus, the feedback vector signal is time-aligned to the input vector signal when the feedback vector signal is transformed back into the time domain. The time-aligned feedback vector signal may then be provided to the predistortion module 135, which uses the time-aligned feedback vector to generate the predistortion that is applied to the input signal, e.g., by defining the appropriate LUTs.

The wireless communication system also includes one or more user equipment 145. The user equipment 145 includes a transceiver 150 for transmitting and receiving signals over the air interface 120 via antenna 155. The user equipment 145 also includes a processor 160 and a memory 165. The processor 160 may be used to execute instructions stored in the memory 165 and to store information in the memory 165 such as the results of the executed instructions. Some embodiments of the processor 160 include a predistortion module 170 and a vector alignment processor 175. The predistortion module 170 may pre-distort input signals based on time-aligned signals provided by the vector alignment processor 175 to compensate for nonlinearities in power amplifiers implemented in the transceiver 150, as discussed herein.

Figure 2:
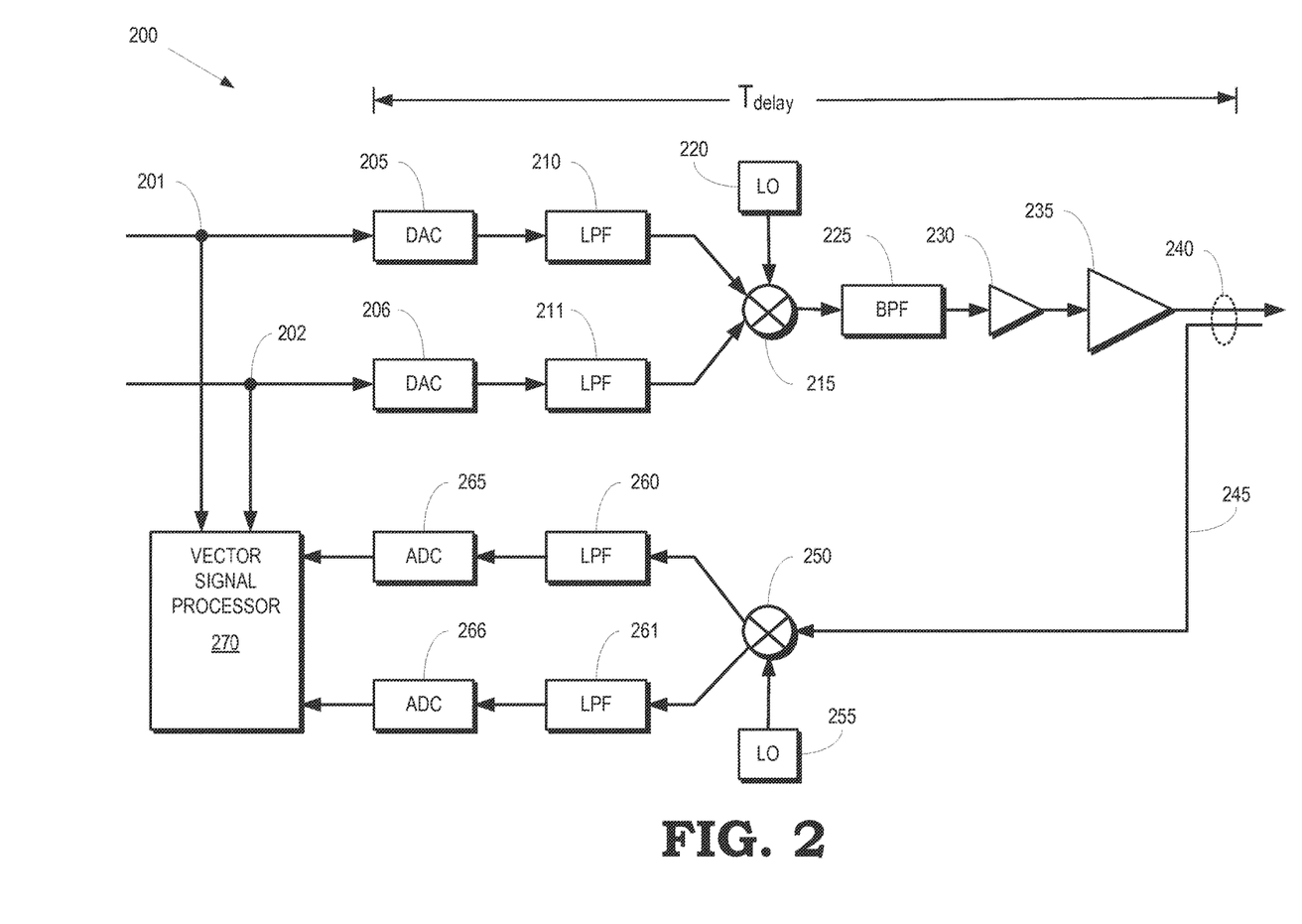
FIG. 2 is a block diagram of a circuit for converting one or more digital signals into amplified analog signals suitable for transmission over an air interface by an antenna according to some embodiments.

FIG. 2 is a block diagram of a circuit 200 for converting one or more digital signals into amplified analog signals suitable for transmission over an air interface by an antenna according to some embodiments. The circuit 200 may be implemented in some embodiments of the base station 105 or the user equipment 145 shown in FIG. 1. The circuit 200 receives input signals at corresponding input nodes 201, 202. In some embodiments, the input signals received at the input nodes 201, 202 are digital vector signals that are generated by a processor such as the processors 125, 160 shown in FIG. 1. Although the circuit 200 includes two input nodes 201, 202 for receiving input vector signals, some embodiments of the circuit 200 may be configured with more or fewer input nodes to receive more or fewer input vector signals.

The circuit 200 includes digital-to-analog (DAC) converters 205, 206 that are used to convert the input vector signals received at the input nodes 201, 202 from the digital domain to the analog domain. The analog signals are then provided to corresponding low pass filters (LPF) 210, 211, which may be used to filter out extraneous high frequency components and provide the filtered analog signals to an up-converter 215. A local oscillator (LO) 220 provides a signal corresponding to a transmission frequency to the up-converter 215 so that the up-converter 215 can combine the filtered analog signals and up convert the combined signals from the baseband frequency to the transmission frequency used for transmissions over the air interface. The up-converted signal is provided to a bandpass filter (BPF) 225 to filter out portions of the signal outside of the transmission bandwidth and provide the filtered, up-converted signal to a driver 230 and a power amplifier 235. The amplified signal may then be provided to one or more antennas such as the antennas 115, 155 shown in FIG. 1 for transmission over the air interface.

A coupler 240 is used to couple a portion of the analog vector output signal generated by the power amplifier 235 into a feedback path 245. The signal portion (referred to herein as the feedback vector signal) is provided to a down-converter 250 that uses a baseband frequency signal provided by a local oscillator 255 to down-convert the feedback vector signal from the transmission frequency to the baseband frequency. The down-converter 250 may also de-multiplex the feedback vector signal into multiple feedback vector signals that correspond to the input vector signals received at the input nodes 201, 202. The feedback vector signals are then provided to LPFs 260, 261 to filter out high frequency components and the filtered feedback vector signals are provided to analog-to-digital converters (ADCs) 265, 266 to convert the filtered feedback vector signals from the analog domain to the digital domain to form digital feedback vector signals.

The circuit 200 is coupled to a vector signal processor 270 that receives the input vector signals received at the input nodes 201, 202 and the feedback vector signals corresponding to the amplified input signals generated by the power amplifier 235. Portions of the circuit 200 between the input nodes 201, 202 and the outputs of the ADCs 265, 266 introduce a time delay ($T_{delay}$) between the input vector signals and the feedback vector signals received at the vector signal processor 270. As discussed herein, timing delays between the input and feedback vector signals can degrade the quality of the predistortion coefficients used to predistort the input vector signals to compensate for nonlinearities in the power amplifier 235. The vector signal processor 270 may therefore use vector transforms to time align the feedback vector signals with the corresponding input vector signals. Some embodiments of the vector signal processor 270 use a vector forward transform to transform the feedback vector signals from a time domain to a transform domain. The vector signal processor 270 may then rotate the transformed feedback vector signal by a phase that is proportional to the time delay ($T_{delay}$) between the input vector signals and the feedback vector signals received at the vector signal processor 270. A vector inverse transform is applied to the rotated feedback vector signal to transform it from the transform domain back into the time domain, where it is now time aligned with the input vector signal. The input vector signal and the time-aligned feedback vector signal may be provided to the predistortion module such as the predistortion modules 135, 170 shown in FIG. 1.

Figure 3:
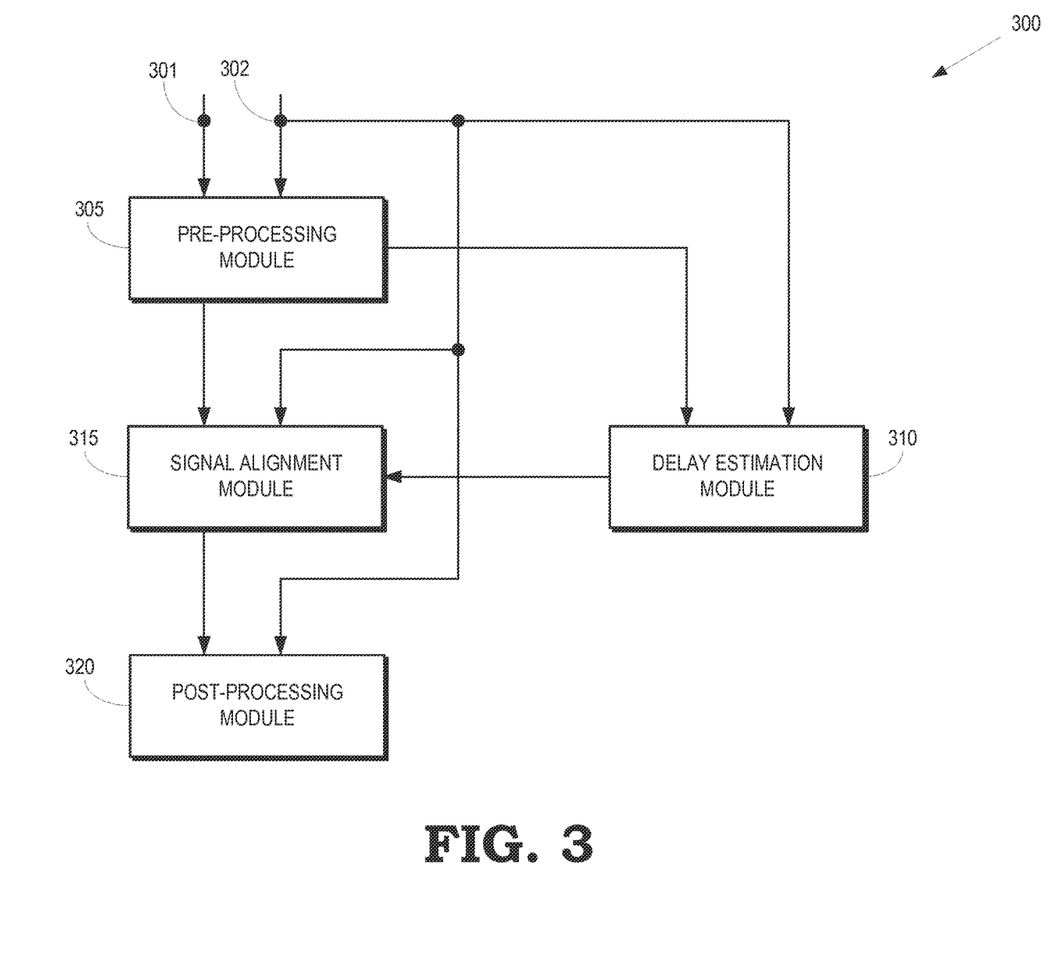
FIG. 3 is a block diagram of a vector signal processor according to some embodiments.

FIG. 3 is a block diagram of a vector signal processor 300 according to some embodiments. The vector signal processor 300 may be used to implement some embodiments of the vector signal processor 270 shown in FIG. 2. The vector signal processor 300 receives one or more feedback vector signals at the feedback node 301 and one or more input vector signals at the input node 302. The feedback vector signals and the input vector signals are provided to a preprocessing module 305 that is used to perform operations such as DC offset compensation on the feedback vector signal to remove DC offsets produced by sampling, gain control, and the like in a circuit such as the circuit 200 shown in FIG. 2. The preprocessing module 305 may also be used to scale the feedback vector signal by an amount determined by the relative powers of the input vector signal and the feedback vector signal.

The preprocessed feedback vector signal and the input vector signal are provided to a delay estimation module 310, which estimates the timing delay between the preprocessed feedback vector signal and the input vector signal. In some embodiments, the delay estimation module 310 estimates a timing delay $T_{delay}=\tau_{int}+\tau_{frac}$, wherein $\tau_{int}$ is the integer delay and $\tau_{frac}$ is the fractional delay of the sampling period. The delay estimation module 310 provides the estimated timing delay to a signal alignment module 315. The preprocessed feedback signal (from the preprocessing module 305) is also provided to the signal alignment module 315. Thus, the signal alignment module 315 time aligns the input vector signal with the preprocessed feedback vector signal using the estimated timing delay. A post-processing module 320 receives the time-aligned feedback vector signal and the input vector signal. Some embodiments of the post-processing module 320 perform operations such as calculating a scaling factor based on a ratio of a product of the input vector signal and the time-aligned feedback vector signal to a magnitude of the time-aligned feedback vector signal. The post-processing module 320 may then scale the time-aligned feedback vector signal using the scaling factor.

Figure 4:
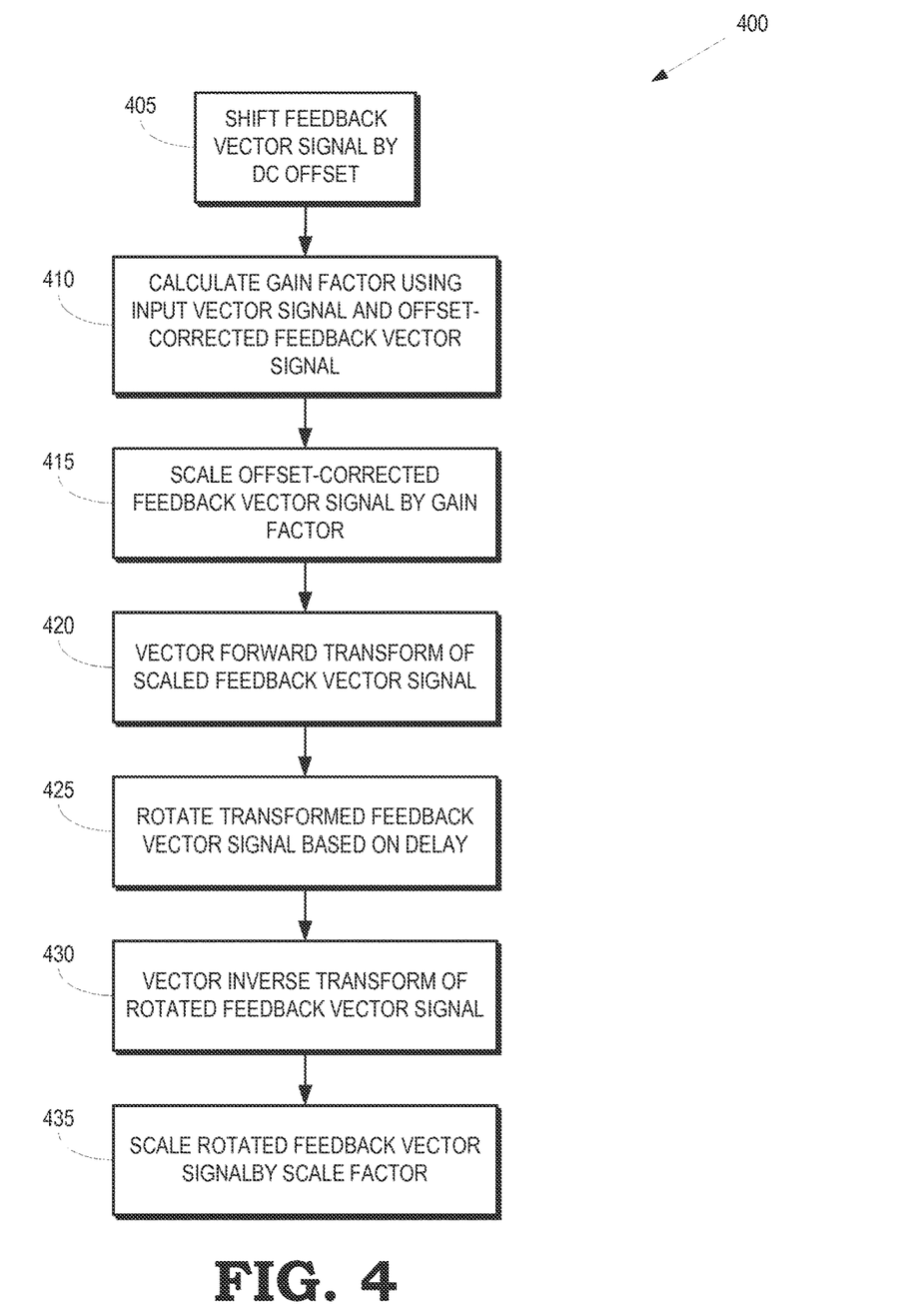
FIG. 4 is a flow diagram of a method for time aligning a feedback vector signal with an input vector signal according to some embodiments.

FIG. 4 is a flow diagram of a method 400 for time aligning a feedback vector signal with an input vector signal according to some embodiments. The method 400 may be implemented in some embodiments of processor such as the vector signal processor 300 shown in FIG. 3, the vector signal processor 270 shown in FIG. 2, or the processors 125, 160 shown in FIG. 1.

At block 405, the processor shifts the feedback vector signal to compensate for a DC offset. For example, the processor may calculate the mean value, $\bar{x}$, of the feedback vector signal, SigB:

$$\bar{x} = \frac{1}{N}\sum_{k=0}^{N-1} SigB_k$$

where N is the length of the feedback vector signal SigB. For example, N may indicate the number of samples of the signal in a frame. The processor may then subtract the mean value to shift the feedback vector signal to an offset-corrected feedback vector signal, MSigB:

$$MSigB = SigB - \bar{x}$$

At block 410, the processor calculates a gain factor using an input vector signal and the offset-corrected feedback vector signal. For example, the processor calculates a vector power $P_F$ for the input vector signal, SigF:

$$P_F = \sum_{k=0}^{N-1} SigF_k * SigF_k^*$$

where SigF*, is the complex conjugate of the input vector signal SigF. The processor also calculates a vector power $P_B$ for the offset-corrected feedback vector signal:

$$P_B = \sum_{k=0}^{N-1} MSigB_k * MSigB_k^*$$

where MSigB* is the complex conjugate of the offset-corrected feedback vector signal MSigB. The gain factor is then computed based on a ratio of the vector powers for the input vector signal and the offset-corrected feedback vector signal:

$$G_{factor} = \sqrt{\frac{P_F}{P_B}}$$

At block 415, the processor scales the offset-corrected feedback vector signal by the gain factor:

$$\text{Sig}BP = M\text{Sig}B * G_{factor}$$

At block 420, the processor transforms the scaled feedback vector signal from a time domain to a transform domain. For example, the processor may compute the vector forward transform (VFT) of the scaled feedback vector signal SigBP to obtain $X_B$.

$$X_B = \text{VFT}(\text{Sig}BP)$$

where the vector forward transform (VFT) can be carried out by equation (1) or equation (2):

$$X(k) = \frac{1}{\sqrt{N}}\left[\sum_{m=0}^{\frac{N}{2}-1} x(2m)U_{N/2}^{mk} + U_N^k \sum_{m=0}^{\frac{N}{2}-1} x(2m+1)U_{N/2}^{mk}\right] \quad (1)$$

$$X(k) = \frac{1}{\sqrt{N}}\left[\sum_{m=0}^{\frac{N}{2}-1} x(2m)U_N^{2mk} + \sum_{m=0}^{\frac{N}{2}-1} x(2m+1)U_N^{(2m+1)k}\right] \quad (2)$$

where U is the transform kernel, x is the vector signal, and X(k) is the VTF. Examples of transform kernels that may be used to transform the scaled feedback vector signals between the time domain and the transform domain include Fourier transforms, wavelet transforms, Hartley transforms, and the like.

At block 425, the processor rotates the transformed feedback vector signal based on a delay, such as a timing delay between the input vector signal and the feedback vector signal. For example, the processor may rotate the vector signal $X_B$ by a phase that is proportional to the delay $T_{delay}$ estimated by the delay estimation module 310 shown in FIG. 3 to obtain the rotated signal vector XBR.

$$X_{BR} = \text{Rotate}(X_B, T_{delay})$$

Some embodiments of the processor may also multiply the signal vector $X_B$ by the rotated vector signal $X_{BR}$ to obtain the variance of the vector signal, $X_{BS}$:

$$X_{BS} = X_B * X_{BR}$$

At block 430, the processor transforms the phase-aligned feedback vector signal from the transform domain to the time domain. For example, the processor may compute the inverse of the signal vector $X_{BS}$ by the vector inverse transform (VIT) to obtain the shifted signal vector SSigB:

$$\text{SSig}B = \text{VIT}(X_{BS})$$

where the vector inverse transform (VIT) can be carried out by equation (3) or equation (4):

$$x(m) = \frac{1}{\sqrt{N}}\left[\sum_{k=0}^{\frac{N}{2}-1} X(2k)U_{N/2}^{-mk} + U_N^{-k}\sum_{k=0}^{\frac{N}{2}-1} X(2k+1)U_{N/2}^{-mk}\right] \quad (3)$$

$$x(m) = \frac{1}{\sqrt{N}}\left[\sum_{k=0}^{\frac{N}{2}-1} X(2k)U_N^{-2mk} + \sum_{k=0}^{\frac{N}{2}-1} X(2k+1)U_N^{-m(2k+1)}\right] \quad (4)$$

where U is the transform kernel and X is the signal vector. Transforming the phase-aligned feedback vector signal from the transform domain to the time domain generates the time-aligned feedback vector signal.

At block 435, the processor scales the time-aligned feedback vector signal by a scaling factor. For example, the processor can compute $C_{num}$:

$$C_{num} = \sum_{k=0}^{N-1} \text{Sig}F_k * \text{SSig}B_k^*$$

The processor also computes $C_{den}$:

$$C_{den} = \sum_{k=0}^{N-1} \text{SSig}B_k * \text{SSig}B_k^*$$

The processor may then use these quantities to compute the scaling factor:

$$S_{fac} = \frac{C_{num}}{C_{den}}$$

The processor shifts the time-aligned feedback vector signal by multiplying with the scaling factor:

$$\text{SSig}BF = \text{SSig}B * S_{fac}$$

The vector signal SSigBF is the vector signal aligned with the feed-forward signal with minimal residue.

The timing delays, gains, scaling factors, and other quantities used to time align the input vector signal and the feedback vector signal may change between different time intervals. For example, some or all these quantities may change from frame-to-frame during transmissions over an air interface between a base station and one or more user equipment. Some embodiments of the method 400 may therefore be iterated at a predetermined time interval or in response to other events such as detecting changes in one or quantities used to time align the input vector signal and the feedback vector signal.

In some embodiments, certain aspects of the techniques described above may implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A method comprising:
   receiving, at a processor, a second vector signal from a circuit in response to the circuit receiving a first vector signal;
   transforming, at the processor, the second vector signal from a time domain to a transform domain; and
   rotating, at the processor, the transformed second vector signal by a phase that is proportional to a time delay between the first and second vector signals to time-align the second vector signal to the first vector signal and generate a time-aligned second vector signal, wherein the time delay is introduced between the first and second vector signals by the circuit, wherein transforming the second vector signal from the time domain to the transform domain comprises calculating an offset based on a sum of components of the second vector signal and subtracting the offset from the components of the second vector signal prior to transforming the offset-corrected second vector signal from the time domain to the transform domain.

2. The method of claim 1, wherein receiving the first vector signal comprises receiving a digital first vector signal, and wherein receiving the second vector signal comprises receiving a digital second vector signal from a circuit comprising at least one digital-to-analog converter to convert the digital first vector signal to an analog first vector signal, at least one low pass filter, a frequency up-converter, a bandpass filter, a power amplifier, a coupler to produce an analog second vector signal based on output from the power amplifier, a frequency down-converter, and at least one analog-to-digital converter to provide the digital second vector signal to the processor.

3. The method of claim 2, further comprising:
   pre-distorting the digital first vector signal based on the digital first vector signal and the time-aligned digital second vector signal to compensate for nonlinearity in the power amplifier.

4. The method of claim 1, wherein transforming the offset-corrected second vector signal from the time domain to the transform domain comprises calculating a first vector power based on the first vector signal and a second vector power based on the offset-corrected second vector signal, calculating a gain based on a ratio of the first vector power to the second vector power, and scaling the offset-corrected second vector signal based on the gain prior to transforming the scaled second vector signal from the time domain to the transform domain.

5. The method of claim 1, wherein transforming the second vector signal from the time domain to the transform domain comprises transforming the second vector signal based on at least one of a first transform equation:

$$X(k) = \frac{1}{\sqrt{N}} \left[ \sum_{m=0}^{\frac{N}{2}-1} x(2m)U_{N/2}^{mk} + U_N^k \sum_{m=0}^{\frac{N}{2}-1} x(2m+1)U_{N/2}^{mk} \right]$$

and a second transform equation:

$$X(k) = \frac{1}{\sqrt{N}} \left[ \sum_{m=0}^{\frac{N}{2}-1} x(2m)U_N^{2mk} + \sum_{m=0}^{\frac{N}{2}-1} x(2m+1)U_N^{(2m+1)k} \right]$$

wherein X(k) represents the second vector signal in the transform domain, x( ) represents the second vector signal in the time domain, N represents a number of samples in the second vector signal, and U represents a transform kernel.

6. A method comprising:
   receiving, at a processor, a second vector signal from a circuit in response to the circuit receiving a first vector signal;
   transforming, at the processor, the second vector signal from a time domain to a transform domain;
   rotating, at the processor, the transformed second vector signal by a phase that is proportional to a time delay between the first and second vector signals to time-align the second vector signal to the first vector signal, wherein the time delay is introduced between the first and second vector signals by the circuit;
   multiplying the time-aligned second vector signal and the transformed second vector signal to form a variance of the rotated second vector signal; and
   transforming the variance of the rotated second vector signal from the transform domain to the time domain to form a time-aligned second vector signal.

7. The method of claim 6, wherein transforming the variance of the rotated second vector signal from the transform domain to the time domain comprises transforming the variance of the rotated second vector signal on the basis of at least one of a first inverse transform equation:

$$x(m) = \frac{1}{\sqrt{N}} \left[ \sum_{k=0}^{\frac{N}{2}-1} X(2k)U_{N/2}^{-mk} + U_N^{-k} \sum_{k=0}^{\frac{N}{2}-1} X(2k+1)U_{N/2}^{-mk} \right]$$

and a second inverse transform equation:

$$x(m) = \frac{1}{\sqrt{N}} \left[ \sum_{k=0}^{\frac{N}{2}-1} X(2k)U_N^{-2mk} + \sum_{k=0}^{\frac{N}{2}-1} X(2k+1)U_N^{-m(2k+1)} \right]$$

wherein X(k) represents the variance of the rotated second vector signal in the transform domain, x( ) represents the variance of the rotated second vector signal in the time domain, N represents a number of samples in the second vector signal, and U represents a transform kernel.

8. The method of claim 7, further comprising:
scaling the time-aligned second vector signal by a scaling factor determined based on a ratio of a product of the first vector signal and the time-aligned second vector signal to a magnitude of the time-aligned second vector signal.

9. An apparatus, comprising:
a circuit to receive a first vector signal and generate a second vector signal in response to receiving the first vector signal, wherein the circuit introduces a time delay between the first vector signal and the second vector signal; and
a processor to transform the second vector signal from a time domain to a transform domain and rotate the transformed second vector signal by a phase that is proportional to the time delay between the first and second vector signals to time-align the second vector signal to the first vector signal and generate a time-aligned second vector signal, wherein the processor is to calculate an offset based on a sum of components of the second vector signal and subtract the offset from the components of the second vector signal prior to transforming the offset-corrected second vector signal from the time domain to the transform domain.

10. The apparatus of claim 9, wherein the first vector signal is a digital first vector signal, and wherein the time-aligned second vector signal is a time-aligned digital second vector signal, and wherein the circuit comprises at least one digital-to-analog converter to convert the digital first vector signal to an analog first vector signal, at least one low pass filter, a frequency up-converter, a bandpass filter, a power amplifier, a coupler to produce an analog second vector signal based on output from the power amplifier, a frequency down-converter, and at least one analog-to-digital converter to provide the digital second vector signal to the processor.

11. The apparatus of claim 10, wherein the processor is to pre-distort the digital first vector signal based on the digital first vector signal and the time-aligned digital second vector signal to compensate for nonlinearity in the power amplifier.

12. The apparatus of claim 9, wherein the processor is to calculate a first vector power based on the first vector signal and a second vector power based on the offset-corrected second vector signal, calculate a gain based on a ratio of the first vector power to the second vector power, and scale the offset-corrected second vector signal based on the gain prior to transforming the scaled second vector signal from the time domain to the transform domain.

13. The apparatus of claim 9, wherein the processor is to transform the second vector signal based on at least one of a first transform equation:

$$X(k) = \frac{1}{\sqrt{N}} \left[ \sum_{m=0}^{\frac{N}{2}-1} x(2m)U_{N/2}^{mk} + U_N^k \sum_{m=0}^{\frac{N}{2}-1} x(2m+1)U_{N/2}^{mk} \right]$$

and a second transform equation:

$$X(k) = \frac{1}{\sqrt{N}} \left[ \sum_{m=0}^{\frac{N}{2}-1} x(2m)U_N^{2mk} + \sum_{m=0}^{\frac{N}{2}-1} x(2m+1)U_N^{(2m+1)k} \right]$$

wherein X(k) represents the second vector signal in the transform domain, x( ) represents the second vector signal in the time domain, N represents a number of samples in the second vector signal, and U represents a transform kernel.

14. An apparatus, comprising:
a circuit to receive a first vector signal and generate a second vector signal in response to receiving the first vector signal, wherein the circuit introduces a time delay between the first vector signal and the second vector signal; and
a processor to transform the second vector signal from a time domain to a transform domain and rotate the transformed second vector signal by a phase that is proportional to the time delay between the first and second vector signals to time-align the second vector signal to the first vector signal, wherein the processor is to multiply the rotated second vector signal and the transformed second vector signal to form a variance of the rotated second vector signal and transform the variance of the rotated second vector signal from the transform domain to the time domain to form a time-aligned second vector signal.

15. The apparatus of claim 14, wherein the processor is to transform the variance of the rotated second vector signal on the basis of at least one of a first inverse transform equation:

$$x(m) = \frac{1}{\sqrt{N}} \left[ \sum_{k=0}^{\frac{N}{2}-1} X(2k)U_{N/2}^{-mk} + U_N^{-k} \sum_{k=0}^{\frac{N}{2}-1} X(2k+1)U_{N/2}^{-mk} \right]$$

and a second inverse transform equation:

$$x(m) = \frac{1}{\sqrt{N}} \left[ \sum_{k=0}^{\frac{N}{2}-1} X(2k)U_N^{-2mk} + \sum_{k=0}^{\frac{N}{2}-1} X(2k+1)U_N^{-m(2k+1)} \right]$$

wherein X(k) represents the variance of the rotated second vector signal in the transform domain, x( ) represents the variance of the rotated second vector signal in the time domain, N represents a number of samples in the second vector signal, and U represents a transform kernel.

16. The apparatus of claim 14, wherein the processor is to scale the time-aligned second vector signal by a scaling factor determined based on a ratio of a product of the first vector signal and the time-aligned second vector signal to a magnitude of the time-aligned second vector signal.

17. A non-transitory computer readable medium embodying a set of executable instructions, the set of executable instructions to manipulate a processor to:
receive a first vector signal and a second vector signal from a circuit in response to the circuit receiving the first vector signal;
transform the second vector signal from a time domain to a transform domain; and
rotate the transformed second vector signal by a phase that is proportional to a time delay between the first and second vector signals to time-align the second vector signal to the first vector signal, wherein the time delay is introduced between the first and second vector signals by the circuit, wherein the set of executable instructions manipulate the processor to calculate an offset based on a sum of components of the second vector signal and subtract the offset from the components of the second vector signal prior to transforming the offset-corrected second vector signal from the time domain to the transform domain.

18. The non-transitory computer readable medium of claim 17, wherein the first vector signal is a digital first vector signal, and wherein the second vector signal is a digital second vector signal, and wherein the set of executable instructions manipulate the processor to pre-distort the digital first vector signal based on the digital first vector signal and the time-aligned digital second vector signal to compensate for nonlinearity in a power amplifier implemented in the circuit.

19. The non-transitory computer readable medium of claim 17, wherein the set of executable instructions manipulate the processor to calculate a first vector power based on the first vector signal and a second vector power based on the offset-corrected second vector signal, calculate a gain based on a ratio of the first vector power to the second vector power, and scale the offset-corrected second vector signal based on the gain prior to transforming the scaled second vector signal from the time domain to the transform domain.

20. A non-transitory computer readable medium embodying a set of executable instructions, the set of executable instructions to manipulate a processor to:
receive a first vector signal and a second vector signal from a circuit in response to the circuit receiving the first vector signal;
transform the second vector signal from a time domain to a transform domain; and
rotate the transformed second vector signal by a phase that is proportional to a time delay between the first and second vector signals to time-align the second vector signal to the first vector signal, wherein the time delay is introduced between the first and second vector signals by the circuit, wherein the set of executable instructions manipulate the processor to multiply the rotated second vector signal and the transformed second vector signal to form a variance of the rotated second vector signal and transform the variance of the rotated second vector signal from the transform domain to the time domain to form a time-aligned second vector signal.

21. The non-transitory computer readable medium of claim 20, wherein the set of executable instructions manipulate the processor to scale the time-aligned second vector signal by a scaling factor determined based on a ratio of a product of the first vector signal and the time-aligned second vector signal to a magnitude of the time-aligned second vector signal.

* * * * *